(12) United States Patent
Wang et al.

(10) Patent No.: US 10,965,148 B1
(45) Date of Patent: Mar. 30, 2021

(54) DATACENTER BACKUP POWER MANAGEMENT

(71) Applicant: Amazon Technologies, Inc., Seattle, WA (US)

(72) Inventors: Ligong Wang, Seattle, WA (US); David Bryan, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 98 days.

(21) Appl. No.: 16/054,804

(22) Filed: Aug. 3, 2018

(51) Int. Cl.
*H02J 9/06* (2006.01)
*G06F 1/30* (2006.01)
*H02J 7/00* (2006.01)
*G06F 1/26* (2006.01)
*H05K 7/14* (2006.01)

(52) U.S. Cl.
CPC .............. *H02J 9/061* (2013.01); *G06F 1/263* (2013.01); *G06F 1/30* (2013.01); *H02J 7/0063* (2013.01); *H05K 7/1492* (2013.01); *H02J 2007/0067* (2013.01); *H02J 2207/10* (2020.01)

(58) Field of Classification Search
CPC ...... H02J 9/061; H02J 7/0063; H02J 2207/10; H02J 2007/0067; G06F 1/263; G06F 1/30; H05K 7/1492
USPC .......................................................... 307/66
See application file for complete search history.

*Primary Examiner* — Hal Kaplan
(74) *Attorney, Agent, or Firm* — Kilpatrick Townsend & Stockton LLP

(57) ABSTRACT

A method for managing backup power in the event of a power supply deficit or disruption includes detecting the power supply deficit and recruiting some or all of the backup battery units associated with electronic devices in the system to provide a backup power supply. Depending on the severity of the power supply failure, the selected backup battery units can be reconfigured from providing power to local electronic devices to providing power along a backup power supply pathway to other electronic components in the system.

20 Claims, 10 Drawing Sheets

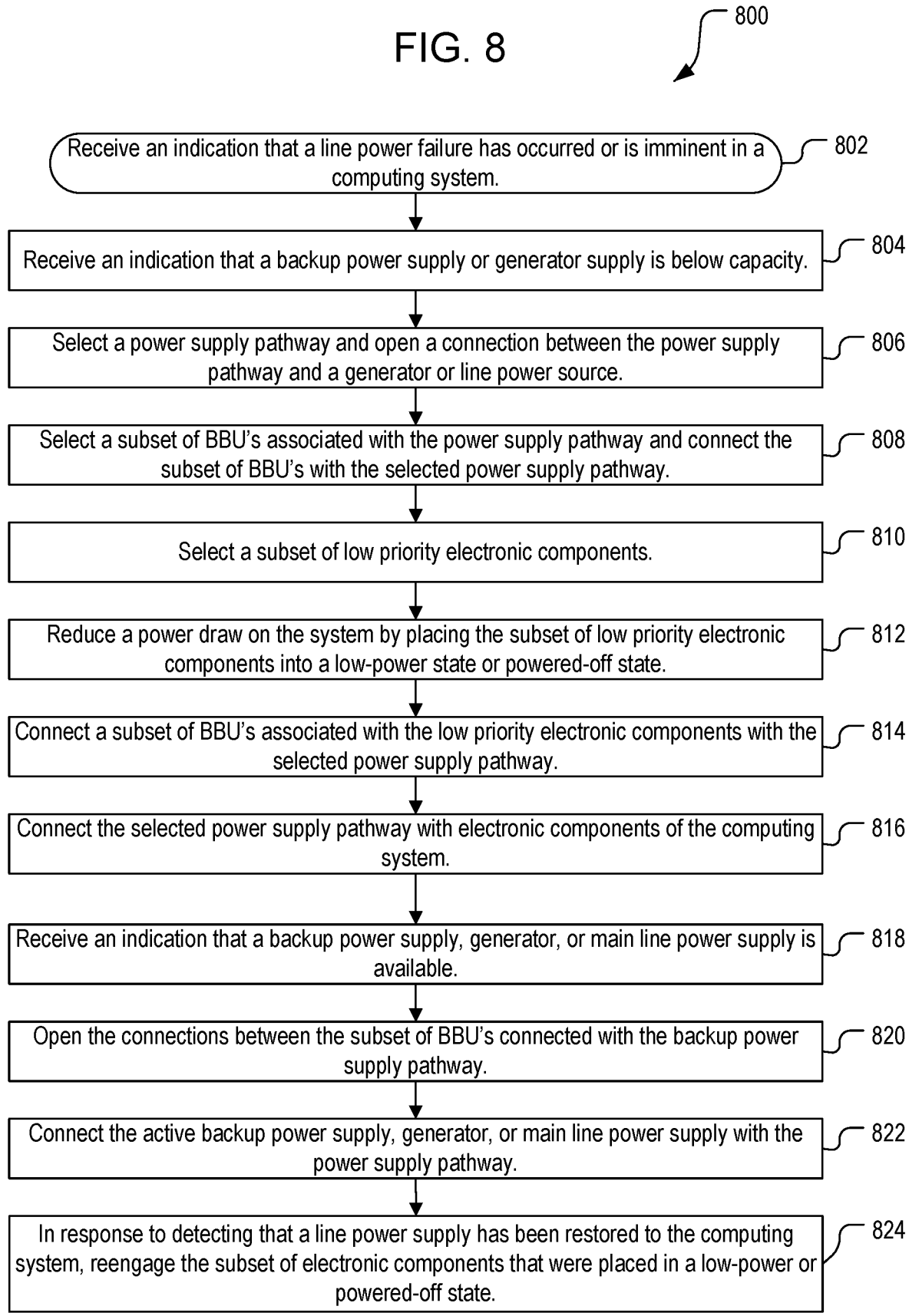

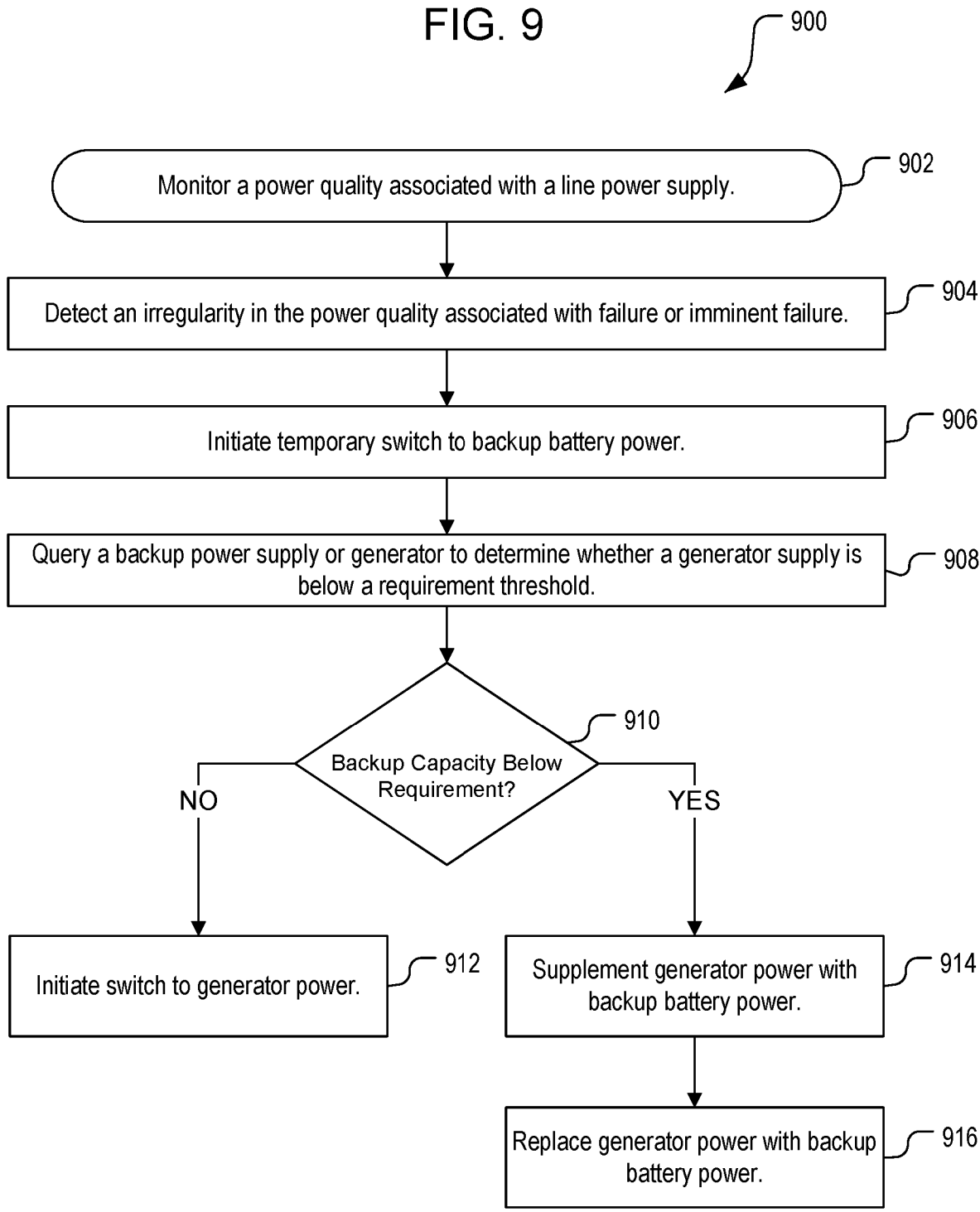

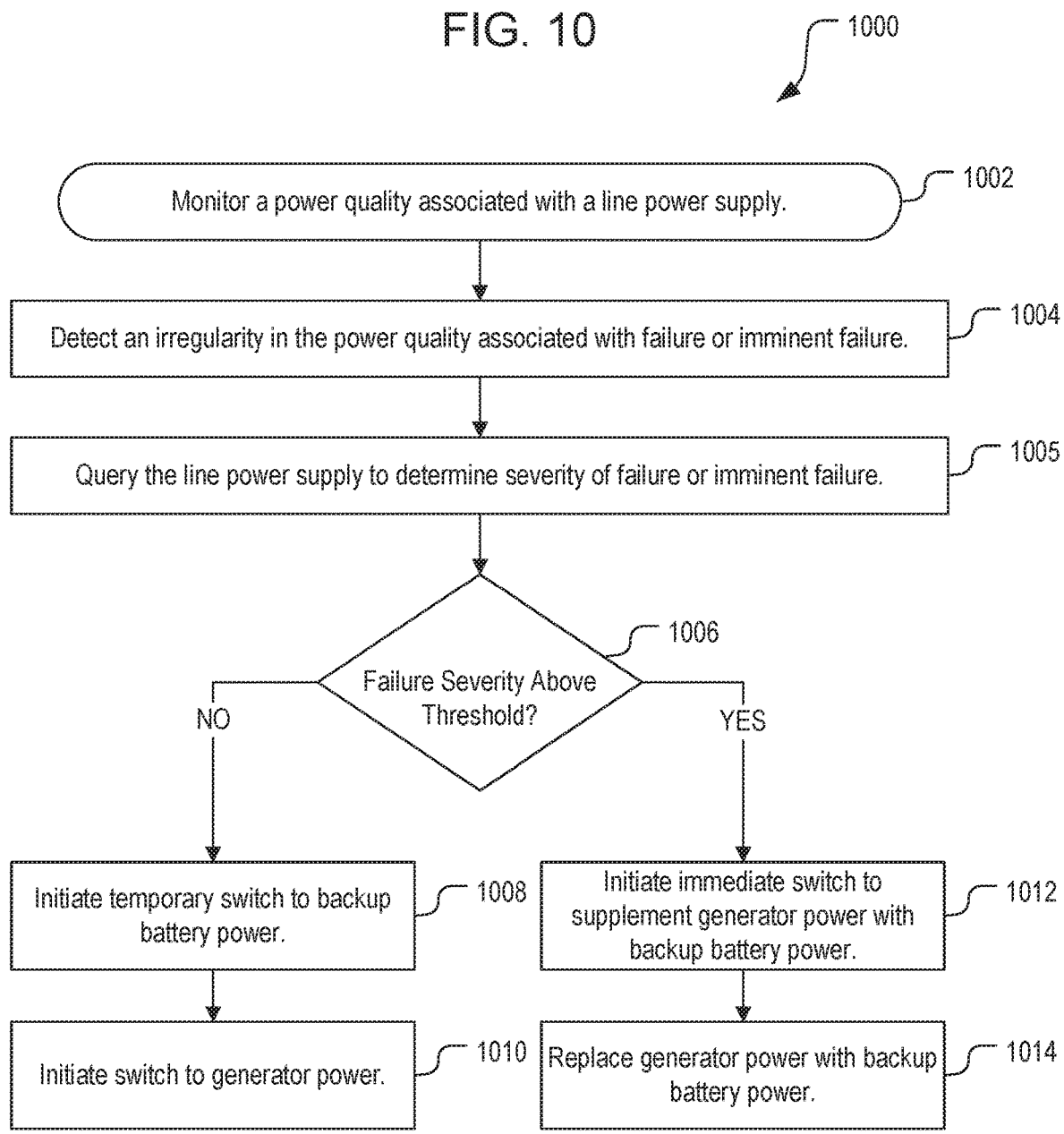

DATACENTER BACKUP POWER MANAGEMENT

BACKGROUND

A datacenter typically contains a collection of computer servers and components for the management, operation and connectivity of those servers, including power management components such as automatic transfer switches or power supply units, which can direct power to electronic components from primary or backup power supplies. Although such systems can typically protect the datacenter from power loss events, long-term outages or large-scale outages can tax the ability of backup power supplies to maintain the operation of the datacenter. In addition, subsequent failure of common backup systems, such as generators, can overwhelm the ability of conventional power management techniques to cope with unexpected power loss. Improved methods of managing backup power are needed for maintaining basic functions in a datacenter when subjected to severe power outage.

BRIEF DESCRIPTION OF THE DRAWINGS

Various embodiments in accordance with the present disclosure will be described with reference to the drawings, in which:

FIG. 8 illustrates a first process for managing power in a datacenter during a power supply deficit;

FIG. 9 illustrates a second process for managing power in a datacenter during a power supply deficit; and FIG. 10 illustrates a third process for managing power in a datacenter during a power supply deficit.

DETAILED DESCRIPTION

In a modern datacenter, the continuity of power to servers and other electronic components can be maintained by employing redundant power supplies. In conventional systems, two or more redundant AC or DC power supplies may be used, including multiple line power sources (e.g., externally generated AC power), or generators, which can be activated when needed, typically in response to a failure or brownout in line power. An automatic transfer switch can be used to monitor the power supplied by a primary power supply to electronics and cause a switch to a secondary power supply if the primary power supply fails. Switching is generally accomplished by causing a mechanical relay between the primary power supply and the electronics to open while another mechanical relay between the secondary power supply and the electronics is closed, although various approaches can be used for the switching operation, including solid-state approaches that do not employ mechanical relays.

In some datacenters and comparable, large-scale systems, temporary backup power can be supplied by battery units (e.g., backup battery units or BBU's) to electronic components, including transfer switches, servers or other computing systems, or even to cooling mechanisms. Such BBU's are charged periodically, intermittently, or continuously from a primary power source, and can be used during a power loss event to provide a temporary power supply to any suitable electronic component, often for a short duration to allow time for secondary power generation to be activated, or for a longer duration to allow for repairs to failed power systems. However, BBU power is generally unsuitable for long durations, as battery storage can be quickly exhausted, and because different electronic components will tend to naturally exhaust their respective BBU's at different rates depending on their usage patterns.

Embodiments herein described are directed to methods and systems of managing power during a power loss event to improve the provision of a continuous supply of backup power to electronic components, e.g. in a datacenter or similar facility.

In the description herein, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Figure 1:
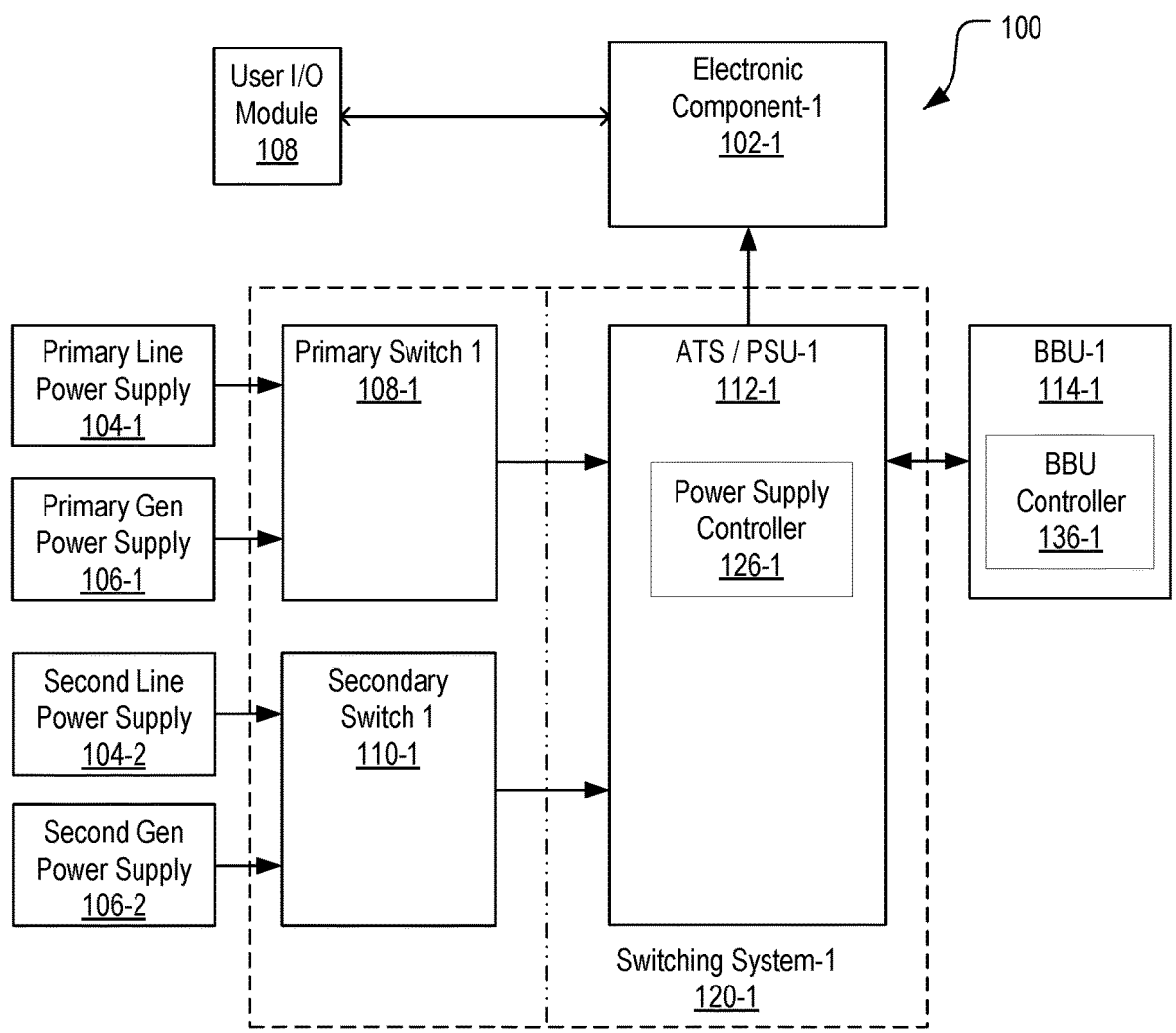
FIG. 1 is a high-level block diagram illustrating a system for powering electronic components including backup power supplies, generators, and backup battery units (BBU), in accordance with various embodiments.

Turning now to the figures, in which like numbers indicate like elements, FIG. 1 is a high-level block diagram illustrating a system 100 for powering electronic components 102 including multiple line power supplies 104, generators 106, and backup battery units (BBU's) 114, in accordance with various embodiments. Duplicate line power supplies can be provided 104-1, 104-2, as well as duplicate generator power supplies 106-1, 106-2. In operation, power is supplied from one of the line power supplies, e.g. the primary line power supply 104-1, where it is connected with an automatic transfer switch and power supply unit (ATS/PSU) 112-1. The provided line power can be connected with the electronic components 102-1, such as servers or the like; or some portion of the line power can be split to maintain a charge in the BBU 114-1. The power demands, line power supply, and/or BBU capacity and supply can be stored by a power supply controller 126-1, which can include onboard processing and memory, and which can manage the supply of power to the electronic components 102-1. Similarly, BBU capacity and supply, as well as operational instructions for charging, discharging, testing, or other actions at the BBU 114-1 can be handled by a BBU controller 136-1.

In the event of a power supply irregularity, repair, or other outage at the primary power line power supply 104-1, the system 100 can switch on a second line power supply 104-2 at the secondary switch 110-1, and close off the primary line power supply 104-1 at the primary switch 108-1. In some cases, the system 100 can switch away from using the line power supplies 104 entirely, and select one of the first or second generator power supplies 106-1, 106-2. Often, this power switch can be performed momentarily, and does not necessarily require temporary backup battery power; but in some cases, the system can also use the BBU 114-1 to temporarily provide power while a transition is made. In some embodiments, the ATS/PSU 112-1 is mechanically configured to automatically switch to the BBU in response to an irregularity or drop in supply voltage. Together, the system of primary and secondary switches 108-1, 110-1, the ATS/PSU 112-1, and power supply controller 126-1, can be referred to as a switching system 120-1 for rapidly switching between the various short-term and long-term backup power supplies and line power supplies as needed to maintain a flow of power to the electronic components 102-1. Some or all of the components of the system can be configured to report data to a user by way of a user I/O module 108, which can be connected with the electronic components 102-1, or with other elements of the system 100. In some alternative embodiments, the system 100 can include primary and/or secondary switches 108-1, 110-1 that are configured separately from each switching system 120-1, i.e. with each primary or secondary switch serving multiple switching systems, in which case each switching system 120-1 can include the ATS/PSU 112-1 and a power supply controller 126-1.

The elements of the system 100 shown in FIG. 1 generally appear in repeated configurations, e.g., with multiple and potentially many sets of electronic components 102-1 or racks of components, with multiple and potentially many ATS/PSU devices 112 operably connected with each electronic component. In some embodiments, predefined sets of switching systems 120 and BBU's 114 are connected with each electronic component 102, or with regular collections of electronic components such as server racks or the like, in order to provide redundancy at the BBU level for each electronic component.

Figure 2:
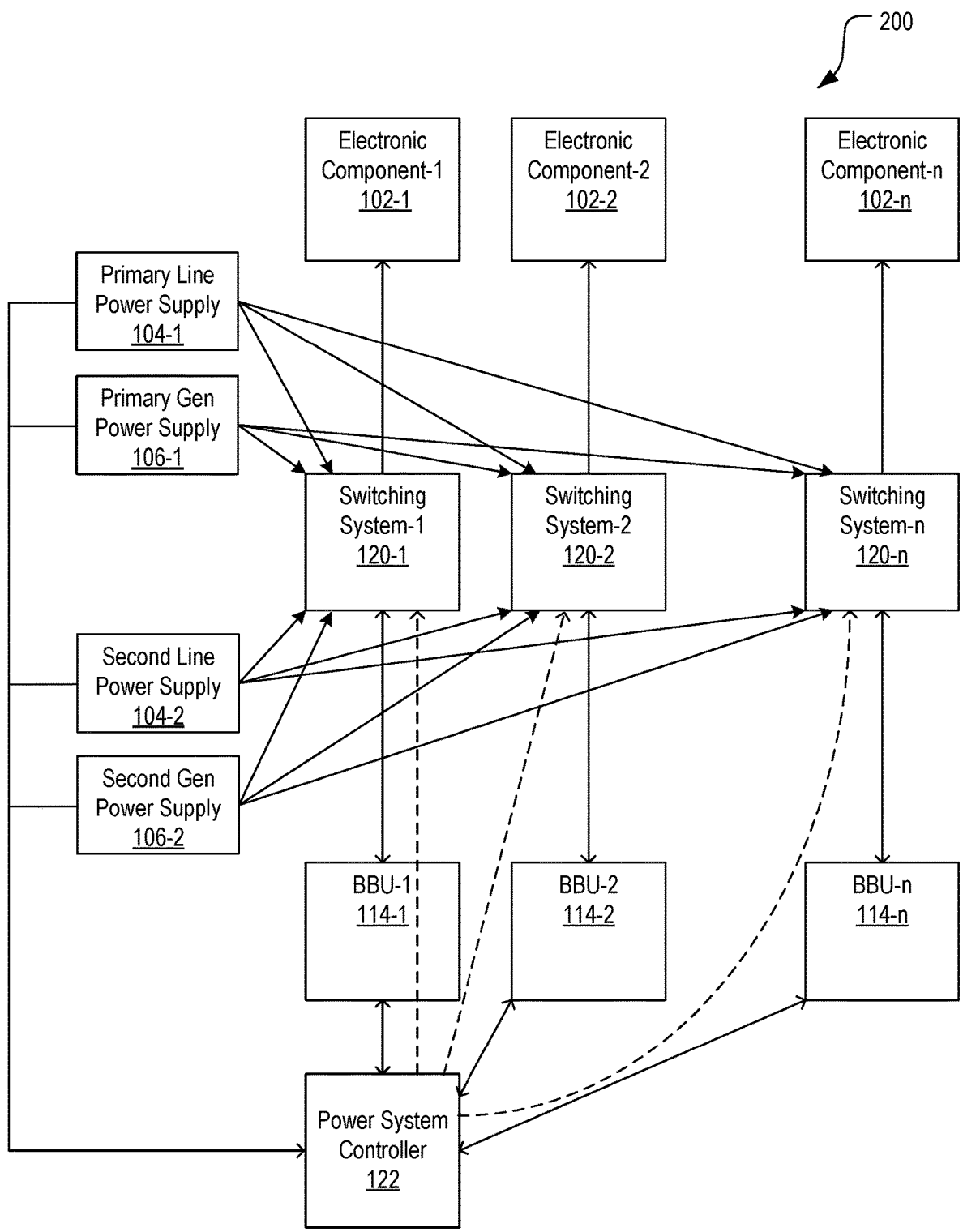
FIG. 2 is a block diagram of an example system providing power to multiple electronic components in accordance with the system of FIG. 1.

For systems including many electronic components 102, multiple switching systems 120 and BBU's 114 can be provided, and connect with one or more power supply grids including, e.g., the line power supplies 104 and generator power supplies 106. For example, FIG. 2 is a block diagram of a system 200 for providing power to multiple electronic components 102 in accordance with the system of FIG. 1. Any suitable number of electronic components 102 (e.g., 102-1, 102-2, . . . 102-n) can be configured to receive power from a corresponding number of switching systems 120 (e.g. 120-1, 120-2, . . . 120-n). In some embodiments, multiple sets of electronic components 102 may be electrically connected with each switching system 120; or alternatively, multiple switching systems may be connected with each set of electronic components 102.

Generally, at least one BBU 114 is associated and connected with each switching system 120 (e.g. BBU's 114-1, 114-2, . . . 114-n), though in some embodiments, multiple BBU's 114 may be connected with each switching system, or vice versa. The various power supplies (e.g., line power supplies 104-1 and 104-2, and generator power supplies 106-1, 106-2) are connected with each one of the switching systems 120. Although not shown, multiple power networks may be present in the same system, in which case different line power supplies may route power to different switching systems. In various embodiments, the switching systems 120 can monitor the health of the line and generator power supplies 104, 106, as well as the BBU's 114, but in some embodiments, the operation of the power supplies 104, 106, and optionally the capacity and energy storage by the BBU's 114, can be monitored by a central power system controller 122.

Under normal operating conditions, each one of the BBU's 114 receives a charging current 128 periodically or during normal operation, and otherwise does not return power to its associated switching system 120 unless a local ATS/PSU switches to backup battery power. In such cases, a conventional system would be capable only of passing electrical power from the BBU 114 to the associated electronic component 102.

Figure 3:
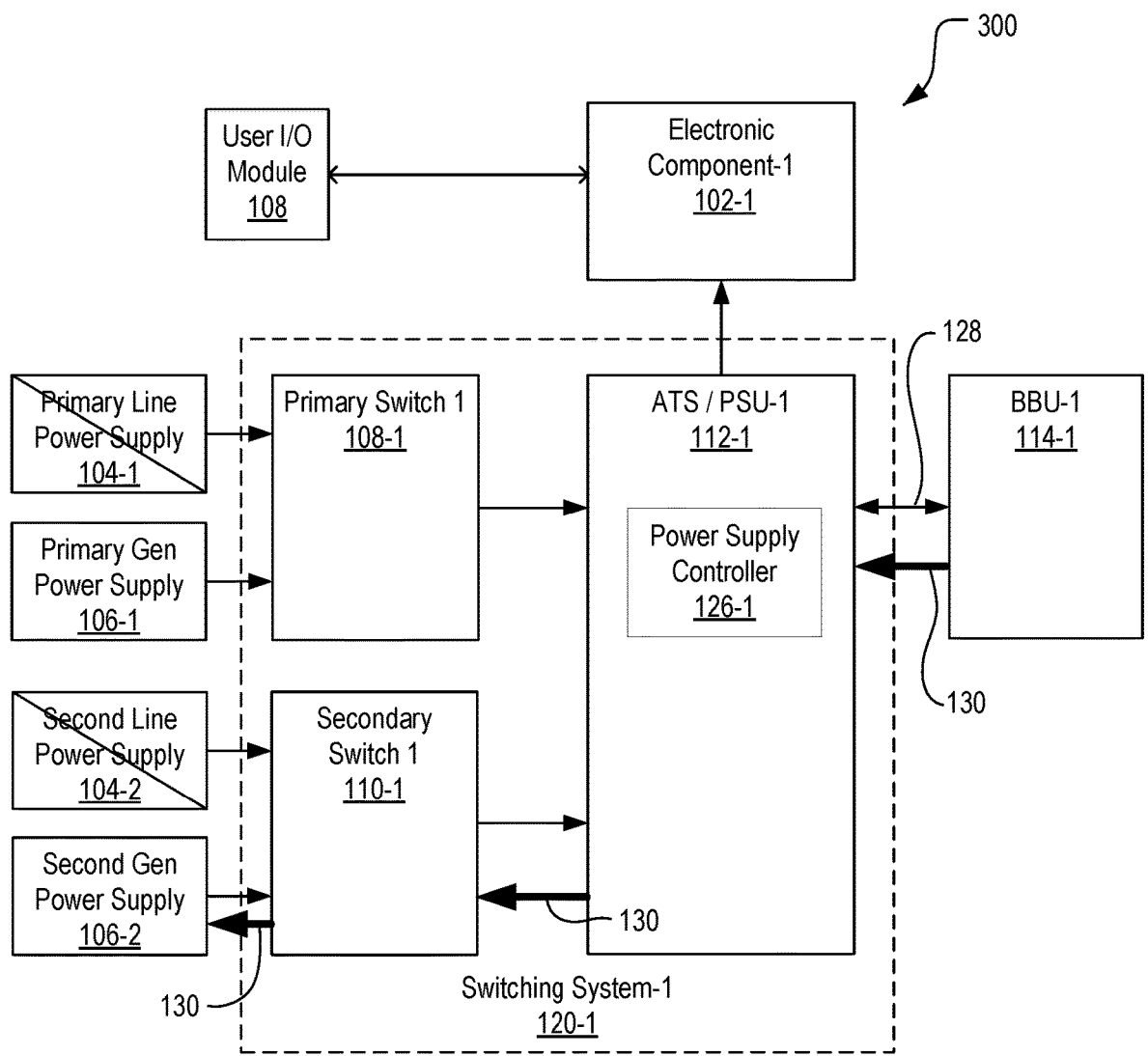
FIG. 3 is a block diagram illustrating a general power management approach to managing a severe power outage by transferring BBU power supplies to a power supply pathway.

FIG. 3 is a block diagram illustrating a general power management approach to managing a severe power outage by transferring BBU power supply from a local BBU 114 to a power supply pathway associated with one of the line or generator power supplies, e.g. power supply pathway 106-2. For example, in one embodiment, the system 300 can detect a severe power outage at the line power supplies 104-1, 104-2, and signal the power supply controller 126-1 to withdraw a backup current 130 from the BBU 114-1, and subsequently pass the backup current 130 upstream via the appropriate switch 110-1 to the selected second generator power supply line 106-2. It will be understood that any suitable generator power supply line, or even unused line power supply line, may be used for this purpose.

As shown in FIG. 2, each of the power supply lines 104, 106 is connected with potentially many other switching systems 120, thus the selected power supply line can be used to transmit this power to other switching systems for use in electronic components 102 throughout a datacenter or other large-scale computing system. Although a singular BBU 114 may be ineffective at maintaining power to the system as a whole, the use of a large portion of the BBU's contained in a datacenter can generally maintain operation of the datacenter for some time. The circulation of BBU power to the system as a whole allows the system to maintain operation of both high-demand and low-demand electronic components until all of the BBU's run out of power; whereas the direct application of BBU backup power to each individual electronic component 102 would cause the elements of the datacenter to fail one-by-one as individual BBU's failed, and likely with the most-used or most demanding electronics and services failing first.

Figure 4:
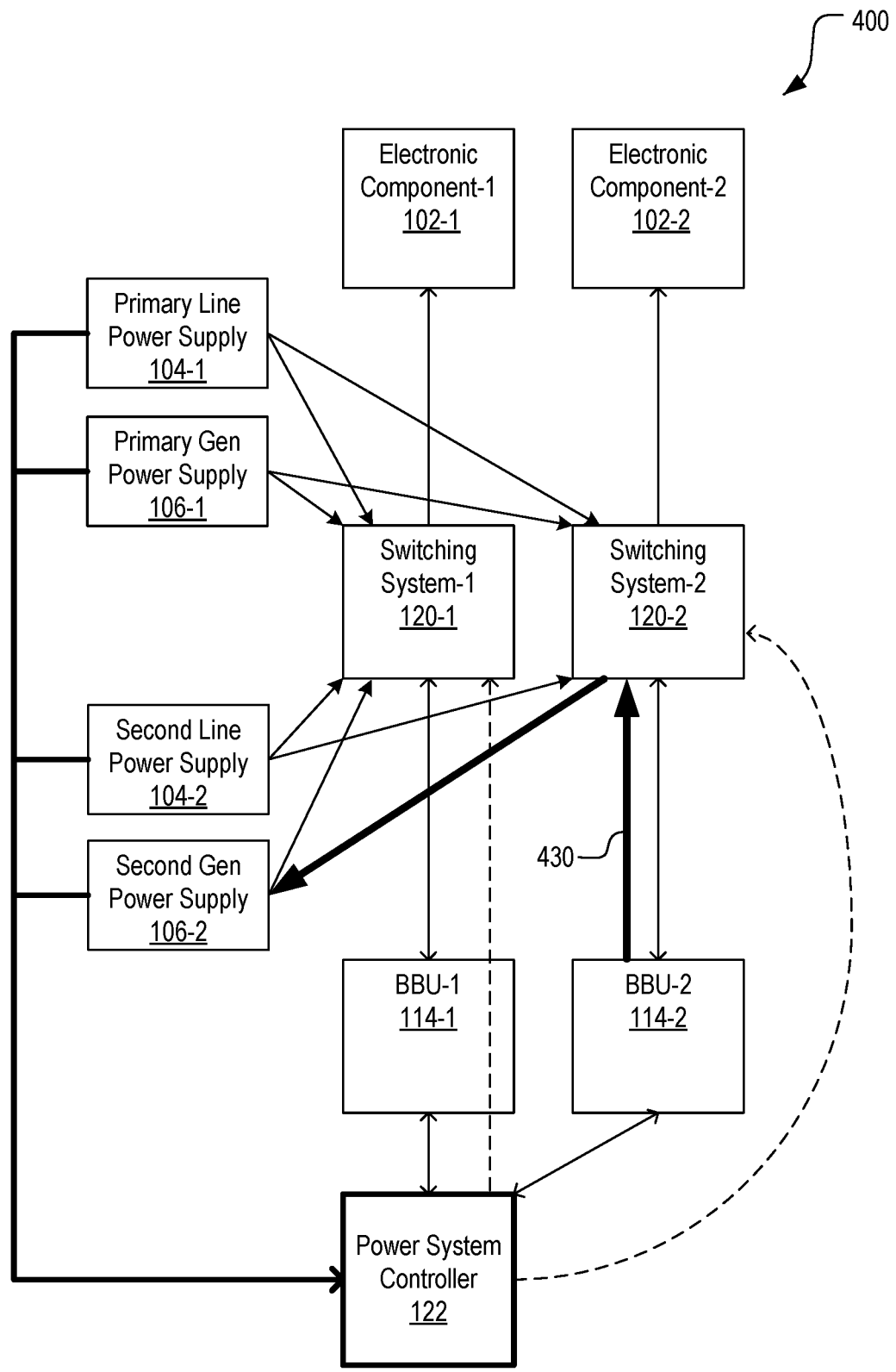
FIG. 4 is a block diagram illustrating a first power management approach in accordance with the general approach of FIG. 3 as extended to a system employing multiple switching systems and BBU's and serving multiple electronic components, and under the control of a centralized power system controller.

Maintaining datacenter operations based on the circulation of BBU power can be implemented according to various specific techniques and under the control of various system components. For example, FIG. 4 is a block diagram illustrating a first detailed power management approach for a power supply system 400 in accordance with the general approach of FIG. 3 as extended to a system employing multiple switching systems and BBU's and serving multiple electronic components, and under the control of a centralized power system controller. Aspects of system 400 may be extended to systems including many electronic components, switching systems, and BBU's.

As shown in FIG. 4, a power system controller 122 can communicate with the power sources, including, e.g., the primary and secondary line power supplies 104, 106, and with the BBU's 114 for measuring the energy storage of each BBU and selectively instructing the BBU's to provide power back to a backup or generator power supply pathway 106-2. As noted above, it will be understood that any suitable power supply pathway, including both line power and generator power supply pathways, can be used as a conduit for providing power by the BBU's 114.

A subset of the BBU's (e.g. BBU 114-2) can be selected and instructed to provide backup power to a collection of the electronic components 102, as opposed to only their local electronic component (e.g. Component -2 102-2). The conversion from the BBU's 114 providing local power to providing collective power is performed by diverting power from each BBU through a local switching system 120-2, and back along the selected power supply pathway 106-2 that has been selected for providing backup power. This backup power supply pathway can be connected to the other switching systems 120, including the switching system 120-2 associated with the selected BBU 114-2, and used to power all of the electronic components 102. The collective power supply stored across a large number of BBU's can provide suitable amounts of backup power to maintain operation of a comparably large number of electronic components. In some embodiments, all of the BBU's 114 may be selected for providing power, or a subset of the BBU's may be selected for providing power while others of the BBU's provide power directly through their local switching system 120 to their associated electronic component 102. In some other embodiments, one or more of the electronic components 102 can be designated low-priority electronic components and be selected for reduction to a low-power or powered off state. In such cases, the associated BBU's 114 of any powered off electronic components 102 may be prioritized when selecting the subset of BBU's for powering the remainder of the electronic components.

Figure 5:
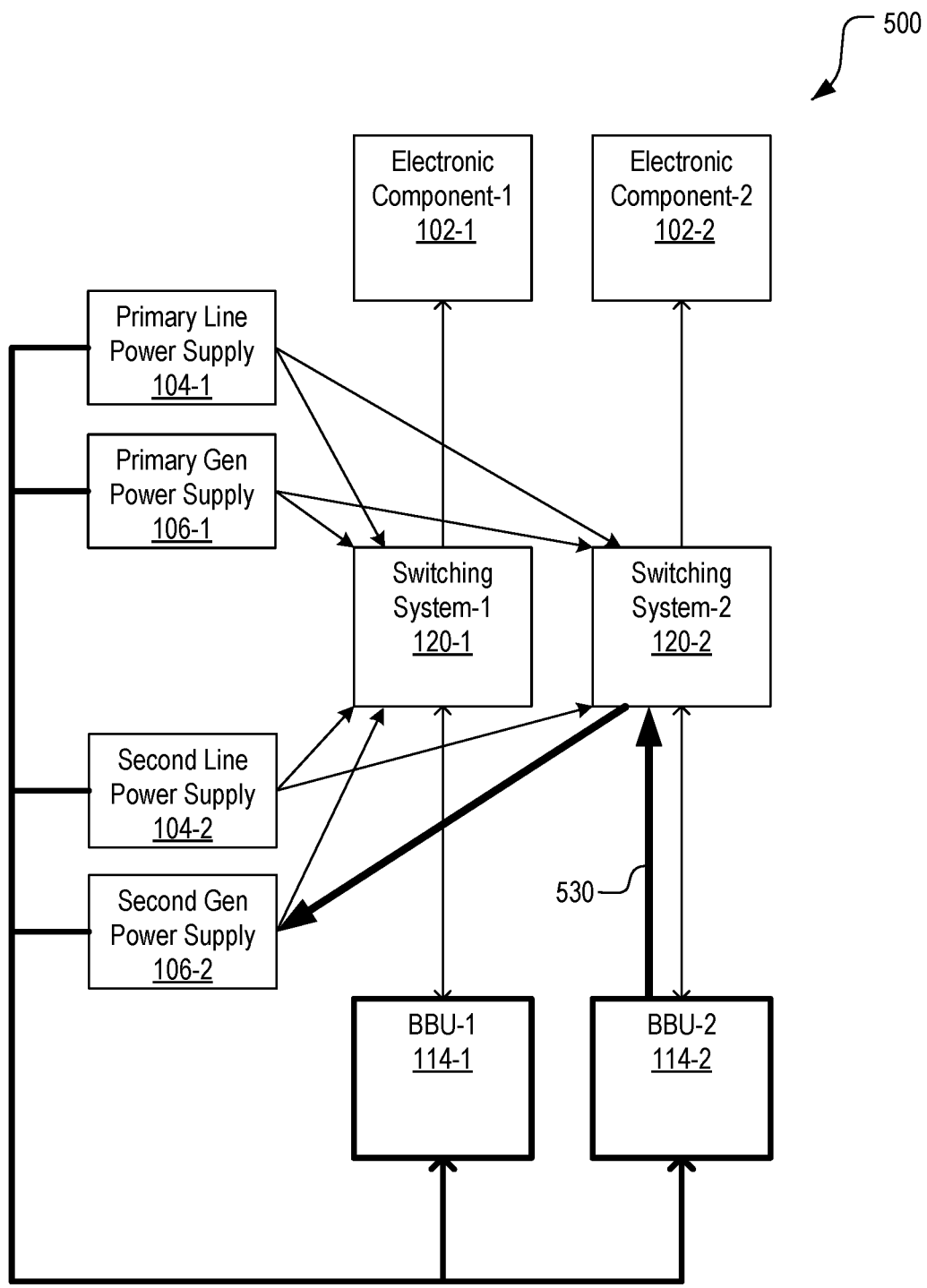
FIG. 5 is a block diagram illustrating a second power management approach as extended to a system employing multiple switching systems and BBU's and serving multiple electronic components, and under the control of a subset of BBU controllers.

FIG. 5 is a block diagram illustrating a second power management approach for a power supply system 500 as extended to multiple switching systems 120 and BBU's and serving multiple electronic components, and under the control of a subset of BBU controllers 114. For example, one or more of the BBU's 114 can communicate with the power sources, including, e.g., the primary and secondary line power supplies 104, 106. In some cases, the BBU's can communicate with each other for measuring the cumulative energy storage of all selected BBU's, and selectively instructing individual BBU's to provide power back to a power supply pathway 106-2. As noted above, it will be understood that any suitable power supply pathway, including both line power and generator power supply pathways, can be used as a conduit for providing power by the BBU's 114. In some embodiments, the BBU's 114, or a selected BBU, may monitor the line power supplies 104 and/or the generator power supplies 106 to detect outages and initiate the process of supplying power to the system.

Figure 6:
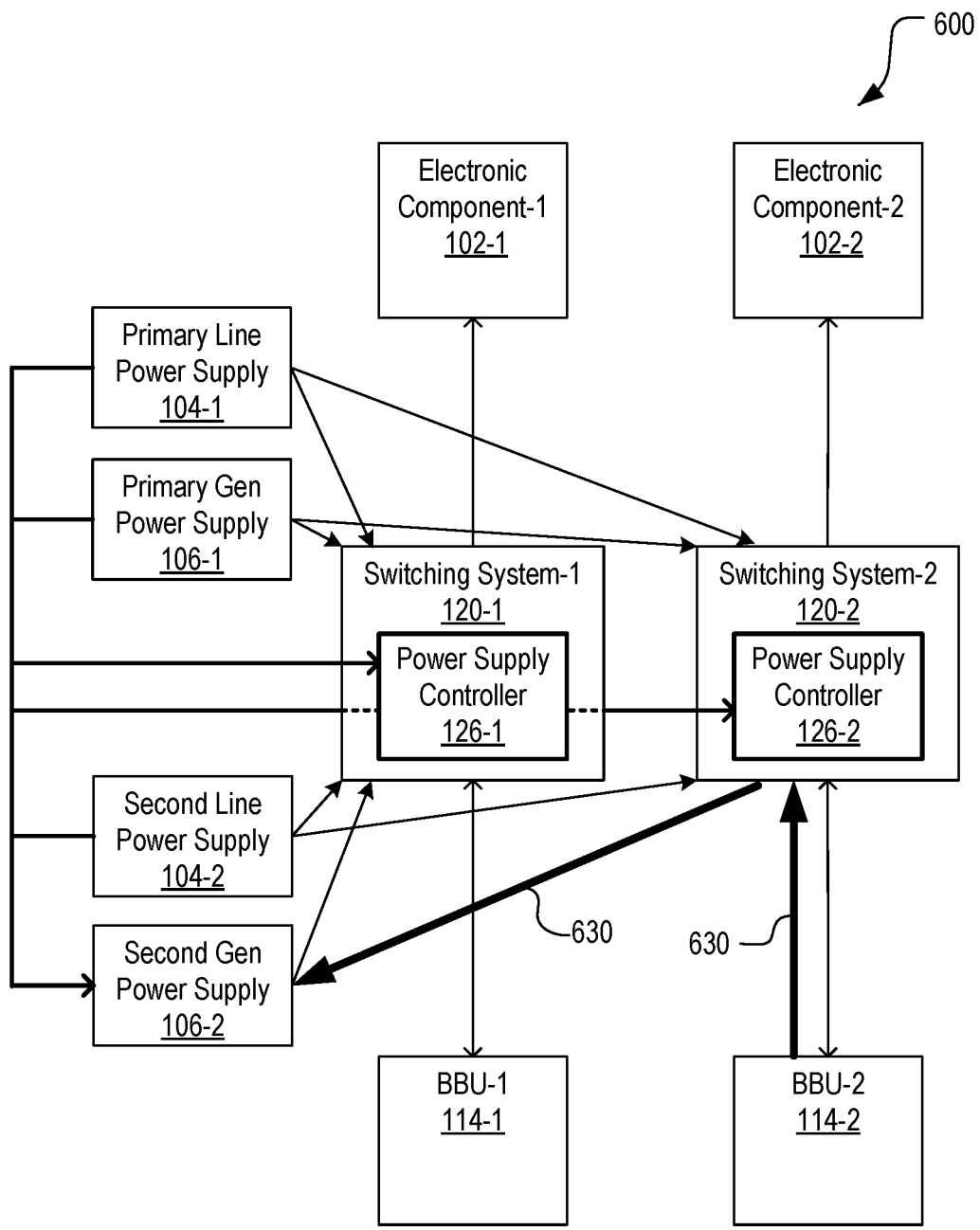
FIG. 6 is a block diagram illustrating a third power management approach as extended to a system employing multiple switching systems and BBU's and serving multiple electronic components, and under the control of a subset of power supply controllers.

FIG. 6 is a block diagram illustrating a third power management approach in a power supply system 600, as extended to multiple switching systems 120 and BBU's 114 serving multiple electronic components 102, and under the control of a subset of power supply controllers 126. For example, one or more of the power supply controllers 126 can communicate with the power sources, including, e.g., the primary and secondary line power supplies 104, 106. In some cases, the power supply controllers 126 can communicate with each other for measuring the cumulative energy storage of all selected BBU's 114, measuring the demand of their respective electronic components 102 and available supply of their local BBU's 114, and selectively instructing individual BBU's to provide power back to a generator or backup power supply pathway 106-2.

Figure 7:
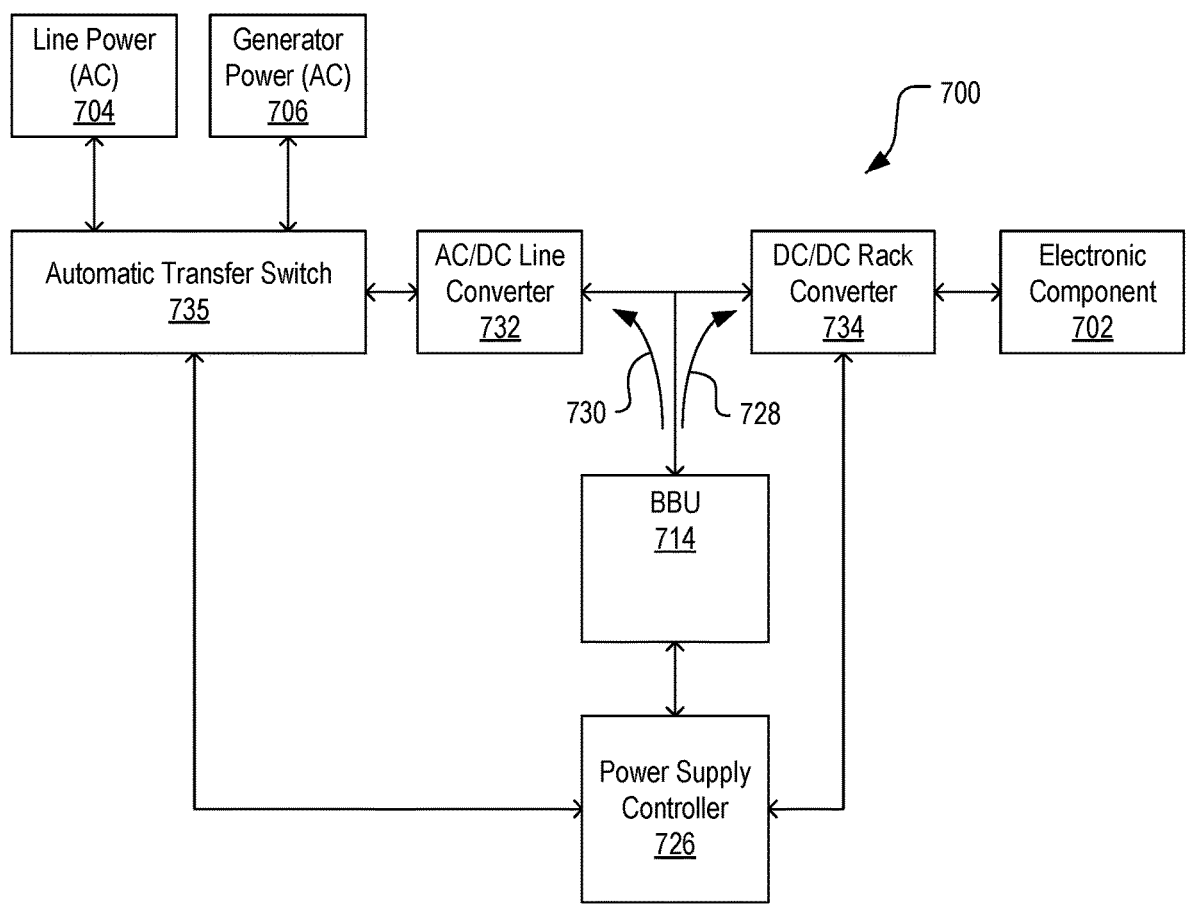
FIG. 7 is a block diagram illustrating an example of a switching system for controlling a direction in which a BBU transfers power.

FIG. 7 is a block diagram illustrating an example of a switching system 700 for controlling a direction in which a BBU 714 transfers power. As shown, each BBU 714 is connected indirectly with power sources such as line power 704 and generator power (706) at one end, and with an electronic component 702 at another. In normal use, power flows from the line power source 704, which is typically an AC power source, through an automatic transfer switch 735 and AC/DC line converter 732, to the BBU 714. When the BBU 714 is charged or configured not to accept charging, all of the power from the line power source 704 will bypass the BBU, pass through a DC/DC rack converter 734 to bring the power to a correct voltage and current, i.e. for an electronic component rack, and power the electronic component 702.

During a short-term power loss event, the BBU 714 can be temporarily recruited to provide emergency backup power to the electronic component 702, in which case the BBU will provide power in a first direction 728 through the DC/DC converter 734. During a severe power loss event or when otherwise indicated, the BBU 714 can instead provide power in a second direction 730, back through the AC/DC line converter 732, and to a power supply pathway such as, e.g., the generator power supply pathway 706. The switch in power supply direction can be achieved in multiple ways. For example, in some embodiments, the BBU can receive a signal that triggers the switch to supplying the reversed current. In some embodiments, a power supply controller 726 in communication with the BBU 714 can cause the switch in power supply direction by controlling the direction through which power is transmitted at the automatic transfer switch 735.

FIG. 8 illustrates a first process 800 for managing power in a datacenter during a power supply disruption, in conjunction with any of the systems 100-700 as shown in FIGS. 1-7. Some or all of process 800, as well as processes 900 and 1000 described below (or any other processes described herein, or variations, and/or combinations thereof) may be performed under the control of one or more computer systems configured with executable instructions and may be implemented as code (e.g., executable instructions, one or more computer programs, or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory. In various embodiments, the processes 800, 900, or 1000 may be carried out by, e.g., a centralized controller such as power system controller 122 (FIG. 4), by distributed control by one or more BBU's 114 (FIG. 5), or by distributed control by one or more power supply controllers 126 associated with the switching systems 120 (FIG. 6).

In the process 800, a power supply system can receive an indication that a line power supply disruption has occurred causing a power supply deficit, or that a power supply deficit is imminent (act 802). This indication can include detecting an irregularity in power quality associated with a power supply, such as a drop in voltage, drop in current, or change in phase or frequency. The indication can also include active indicia, such as an activation, deactivation, or change in a diagnostic signal provided in conjunction with power from the power supply.

In some embodiments, the system can also receive an indication that a backup power supply or generator supply does not have sufficient capacity to meet a power supply deficit resulting from the failure (act 804). This indication can include, for example, an indication that a duration of the failure is unknown or exceeds the period of time during which backup batteries can provide power, or can include an indication that the capacity of generators available to provide power is insufficient to power the system. The indication may include an indication that a generator has failed.

In response to receiving the initial indication of the power supply disruption, or in response to both an indication of power supply deficit and an unmet shortfall or deficit in backup supply, the system can select a power supply pathway for use as a new backup power supply, and open a connection between the power supply pathway and any generator or line power source already connected with the pathway to prevent interference with the pathway (act 806). The system can then recruit or select a subset of BBU's associated with the power supply pathway and connect the subset of BBU's with the selected power supply pathway (act 808). The selection of BBU's may be performed by the system based on stored data containing information about the topology of the power supply system, or in some embodiments, topology information can be generated on-demand or updated by the system on an intermittent or continuous basis. For embodiments that utilize a central backup power supply controller, information about the power system topology can be stored locally at the power supply controller in non-transitory memory. In at least some embodiments, the system identifies an unused or underutilized power supply pathway, such as a generator or backup power supply pathway associated with a generator that is not operational or not operating, or a line power supply pathway that is not currently utilized, and selects that pathway. This connection effectively causes the selected BBU's to act as an alternative power source connected to the power supply pathway in lieu of the generator or line power source normally connected thereby. In some embodiments, the subset of BBU's may also be connected with a live power supply pathway to contribute additional power to the pathway. For example, in some embodiments, the BBU's may be recruited to supplement power supplied by a generator rather than merely replacing the generator.

The system can also selectively turn off or reduce the power supplied to low-priority components in order to extend the life of the power supply to critical datacenter components. For example, the system can select a subset of low priority electronic components (act 810), and then instruct the selected low-priority components to reduce their collective power draw on the system by placing some, all, or a subset of the low priority electronic components into a low-power state or powered-off state (act 812). Priority information can be associated with each datacenter component, and can include indications such as a number or value associated with a discrete priority level of each component and/or a continuum of priority levels on which each component can fall. Low-priority components can include, e.g., servers that provide ancillary services to a datacenter, as opposed to high-priority components that can include, e.g., servers that provide core business services. Priority information for datacenter components can be assigned automatically, i.e. by the system assigning priority values to each component based on any suitable number of factors such as: utilization, dependency (e.g., the number and/or relative priority of services that depend on the component), or can occur manually by user-assigned indications of a component's priority, or a combination of the above. Datacenter component prioritization can be tiered, with a subset of components at each of two or more levels of priority (e.g., critical, high, and low priority), can be assigned priority levels in series, or according to various other schemes of prioritization that are known in the art. This reduction in power draw can further extend the life of the power supply to the entire datacenter, as BBU power supplies that might ordinarily go unused can instead be recruited to power high-priority components. To that end, the system can connect a subset of BBU's associated with the low priority electronic components with the selected power supply pathway (act 814).

When the various BBU's for providing backup power have been selected and connected with the power supply pathway, the system can connect the selected power supply pathway with electronic components of the computing system (act 816), and continue to power these components until a line power or sufficient generator power is again available, or until the recruited BBU's run out of power. In some embodiments, BBU's may be recruited and added to the power supply pathway on the fly as BBU's become available, or in response to changes in the power requirements of the system.

The process of providing backup power by way of BBU's through a backup power supply pathway can be reversed. For example, in some embodiments, the system can receive an indication that a backup power supply, generator, or main line power supply is available (act 818), and proceed to open a connection between the subset of BBU's connected with the backup power supply pathway (act 820) in concert with connecting the backup power supply, generator, or main line power supply. When the backup power supply pathway is again available, the system can reconnect the original backup power supply, generator, or main line power supply with the power supply pathway (act 822), and can also reengage any components, e.g. low-priority components, that had been powered down or placed in a reduced-power state during the duration of the power disruption event (act 824).

According to various embodiments, power can be supplied through the backup power supply pathway from the BBU's so as to match the normal operating parameters of the power supply system as a whole, including matching a polyphase power supply system such as a three-phase power system. In such cases, a controller (e.g. power supply controller 726, or other controller) associated with each BBU contributing to the backup power supply pathway can modify the power supplied by that BBU to synchronize to a voltage cycle of a three-phase system, while other BBU's contributing to the backup power supply pathway can be conformed to the other cycles of the three-phase system. In some embodiments, the subset of BBU's selected to provide backup power though the backup power supply pathway are subdivided into groups, each group synchronized to a particular phase of the polyphase power supply system. Similar methods can be used to convert power supplied by a collection of BBU's to any other suitable polyphase system.

Various operations can be performed in conjunction with detecting the power supply deficit in order to determine whether, and how, to supplement the power system with BBU power. For example, FIG. 9 illustrates a second process 900 for managing power in a datacenter during a power supply disruption in conjunction with a temporary switch to backup power based on a generator capacity failure. In process 900, the system can monitor a power quality associated with a line power supply to the power system (act 902). The system can detect failure or imminent failure of the power system by detecting an irregularity in the power supply, or by receiving an indication from a monitoring device or from the power supply that signals a power supply deficit (act 904). In some embodiments, the system can immediately initiate a temporary switch to backup battery power (act 906). This immediate switch may be controlled centrally, or may be performed automatically at any number of automatic switching systems throughout the datacenter in response to the switching systems detecting power irregularities or a power supply deficit.

When the power quality irregularity or system power supply deficit has occurred, the system can query a backup power supply or generator, as well as the electronic components that make up the load on the power system, to determine whether the supply of power from backup sources or backup generation is sufficient to maintain the system, or falls below a threshold (act 908). If the backup capacity of the generator does not fall below the threshold (act 910), the system may initiate a switch to generator power without recruiting BBU's to supplement the power supply (act 912). If the backup capacity does fall below the threshold requirements of the power system, the system can recruit BBU's to supplement the generator power with backup battery power throughout the system (act 914). In some cases, the system can also replace the use of generator power with backup battery power from the BBU's (act 916). In some embodiments, backup battery power may be provided to supplement generator power at a later time, for example, in response to receiving a user instruction, or receiving an indication that an expected duration of the power supply failure or irregularity has increased so that the capacity of backup generation is no longer sufficient.

In some embodiments, the power system can initiate a switch to using backup battery power to supplement the power system in response to the severity of the power supply failure. For example, FIG. 10 illustrates a third process 1000 for managing power in a datacenter during a power supply disruption based on a power supply deficit severity. In process 1000, the system can monitor a power quality associated with a line power supply (act 1002), and can detect failure or imminent failure of the power system by detecting an irregularity in the power supply, or by receiving an indication from a monitoring device or from the power supply that signals a power supply deficit (act 1004). The system can then query the line power supply or a monitoring device associated with the power supply to determine a severity of the power supply failure (act 1005). This determination can include, for example, determining whether the line power supply is at low power or has failed entirely, determining whether more than one source of the line power supply has failed (i.e., whether some parts of the datacenter are still receiving power), and determining whether an expected duration of the failure exceeds a threshold time period during which backup generation is sufficient. In some embodiments, the system also queries the backup or generator-based power supply to determine whether backup power or generator power is available.

If the system determines that the failure severity of the power supply deficit does not exceed a threshold (act 1006), the power system can elect not to use backup battery power to support the system, although the system may still initiate a temporary switch to using the BBU's locally to support electronic components while generator power is being brought on-line (act 1008), and then switch to using the generator power or other backup power supply (act 1010). Conversely, if the system determines that the severity of the power supply deficit exceeds the threshold (act 1006), the system can immediately initiate a switch using the BBU's to support the power system (act 1012). This switch can also include an intermediate step of supporting individual electronic devices by their associated BBU's. The BBU's can be used in conjunction with a generator to extend the duration of the supply of backup power, or can be used to replace generator power (act 1014).

Various computing environments may be used, as appropriate, to implement various embodiments as described herein including web- or cloud-based computing environments, computing environments based on local controllers, or combinations of the above. User or client devices can include any of a number of general purpose personal computers, such as desktop or laptop computers running a standard operating system, as well as cellular, wireless and handheld devices running mobile software and capable of supporting a number of networking and messaging protocols. Such an environment also can include a number of workstations running any of a variety of commercially-available operating systems and other known applications for purposes such as development and database management. These workstations also can include other electronic devices, such as dummy terminals, thin-clients, gaming systems and other devices capable of communicating via a network and used for communicating with sensors, displays, actuators, and user interfaces, among other devices.

For example, user interfaces (such as user I/O module 108, FIG. 1) can include any appropriate device operable to send and receive requests, messages, or information over an appropriate network and convey information back to a user of the device. Examples of such devices include portable displays, personal computers, cell phones, handheld messaging devices, laptop computers, set-top boxes, personal data assistants, electronic book readers, and the like. The network can include any appropriate network, including an intranet, the Internet, a cellular network, a local area network, or any other such network or combination thereof. Components used in conjunction with such a network can depend at least in part upon the type of network and/or environment selected. Protocols and components for communicating via such a network are well known and will not be discussed herein in detail. Communication over the network can be enabled by wired or wireless connections and combinations thereof.

Suitable computing environments can include, in various embodiments, a server and data store. It should be understood that there can be several servers, layers, or other elements, processes, or components, which may be chained or otherwise configured, which can interact to perform tasks such as obtaining data, processing said data, and communicating data or with users. For example, according to various embodiments, a controller such as controller 102 (FIG. 1) can include a server and/or a virtual machine emulated by a server. As used herein the term "data store" refers to any device or combination of devices capable of storing, accessing, and retrieving data, which may include any combination and number of data servers, databases, data storage devices, and data storage media, in any standard, distributed, or clustered environment. The server can include any appropriate hardware and software for integrating with the data store as needed to execute aspects of one or more applications for the client device, handling a majority of the data access and logic for an application. The server provides access control services in cooperation with the data store and is able to generate content such as text, graphics, audio, and/or video to be transferred to the user, which may be served to the user by the Web server in the form of HyperText Markup Language ("HTML"), Extensible Markup Language ("XML"), or another appropriate structured language in this example. It should be understood that servers are not required and are merely example components, as structured code discussed herein can be executed on any appropriate device or host machine as discussed elsewhere herein.

The data store can include several separate data tables, databases or other data storage mechanisms and media for storing data relating to a particular aspect. For example, the data store can include a mechanism for storing data for reporting, analysis, or other such purposes. The data store is operable, through logic associated therewith, to receive instructions and obtain, update or otherwise process data in response thereto.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

A computing environment according to various embodiments can be a distributed computing environment utilizing several computer systems and components that are interconnected via communication links, using one or more computer networks or direct connections. However, it will be appreciated by those of ordinary skill in the art that the embodiments discussed above could operate equally well in a computing environment having fewer or a greater number of components, including systems operated under the control of a single computing device in communication with any suitable combination of the various sensors, input/output devices and/or actuators discussed herein.

Most embodiments utilize at least one network that would be familiar to those skilled in the art for supporting communications using any of a variety of commercially-available protocols, such as Transmission Control Protocol/Internet Protocol ("TCP/IP"), Open System Interconnection ("OSI"), File Transfer Protocol ("FTP"), Universal Plug and Play ("UpnP"), Network File System ("NFS"), Common Internet File System ("CIFS"), and AppleTalk®. The network can be, for example, a local area network, a wide-area network, a virtual private network, the Internet, an intranet, an extranet, a public switched telephone network, an infrared network, a wireless network, and any combination thereof.

In embodiments utilizing a Web server, the Web server can run any of a variety of server or mid-tier applications, including Hypertext Transfer Protocol ("HTTP") servers, FTP servers, Common Gateway Interface ("CGI") servers, data servers, Java servers, and business application servers. The server(s) also may be capable of executing programs or scripts in response to requests from user devices, such as by executing one or more Web applications that may be implemented as one or more scripts or programs written in any programming language, such as Java®, C, C#, or C++, or any scripting language, such as Perl, Python, or TCL, as well as combinations thereof. The server(s) may also include database servers, including without limitation those commercially available from Oracle®, Microsoft®, Sybase®, and IBM®.

Computing environments as discussed herein can include a variety of data stores and other memory and storage media as discussed above. These media can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit ("CPU"), at least one input device (e.g., a mouse, keyboard, controller, touch screen, or keypad), and at least one output device (e.g., a display device, printer, or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Suitable media can also include a computer-readable storage media reader, a communications device (e.g., a modem, a network card (wireless or wired)), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Storage media computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, Electrically Erasable Programmable Read-Only Memory ("EEPROM"), flash memory or other memory technology, Compact Disc Read-Only Memory ("CD-ROM"), digital versatile disk (DVD), or other optical storage, magnetic cassettes, magnetic tape, magnetic disk storage, or other magnetic storage devices, or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A system for controlling distribution of backup power for powering servers in a datacenter, the system comprising:
   a plurality of servers;
   a main power supply electrically connected with the servers;
   a backup power supply pathway electrically connected with the servers;
   a backup power supply comprising a plurality of backup battery units separate from the power supply pathway, each backup battery unit electrically connected with and configurable to power a respective server of the plurality of servers; and
   a controller configured with executable instructions to operate the backup power supply to:
      receive an indication of a power supply deficit at the main power supply;
      in response to receiving the indication, reconfigure a switching system connected with the backup power supply from a first backup power configuration, in which each backup battery unit powers a corresponding server of the plurality of servers, to a second backup power configuration, in which each backup battery unit contributes power to the backup power supply pathway; and
      cause the backup power supply pathway to distribute power to the plurality of servers.

2. The system of claim 1, wherein the plurality of backup battery units comprises multiple groups of backup battery units, each group of backup battery units being electrically connected with a server of the plurality of servers.

3. The system of claim 1, wherein the backup power supply pathway is a backup generator power supply pathway configured to receive power from a backup generator, and wherein the controller is further configured to cause the plurality of backup battery units to supplement the power from the backup generator.

4. The system of claim 1, wherein the controller is further configured to:
   receive priority information indicating that a subset of the servers have a reduced priority; and
   instruct the subset of the servers with reduced priority to enter a low-power state or powered-down state.

5. The system of claim 1, wherein the controller is further configured to:
   in response to receiving the indication, reconfigure the backup power supply from a normal configuration, in which the servers draw power from the main power supply, to the first backup power configuration;
   detect a severity of the power supply deficit;
   compare the severity of the power supply deficit to a threshold;
   in response to the severity exceeding the threshold, reconfigure the switching system from the first backup power configuration to the second backup power configuration.

6. The system of claim 1, further comprising a reversible AC/DC power converter arranged along the backup power supply pathway between a power source associated with the backup power supply pathway and a backup battery unit of the plurality of backup battery units, the reversible AC/DC power converter operable to convert DC current from the backup battery unit of the plurality of backup battery units to AC current on the backup power supply pathway.

7. A method, comprising:
   receiving an indication of a power supply deficit in a main power supply that supplies power to a plurality of electronic components;
   selecting a backup battery unit from a plurality of backup battery units associated with the plurality of electronic components;
   reconfiguring a switching system connected with the backup battery unit from a first configuration, in which the backup battery unit is electrically connected with one of the electronic components, to a second configuration, in which the backup battery unit is electrically connected with a backup power supply pathway; and causing the backup battery unit to provide power to the plurality of electronic components through the backup power supply pathway.

8. The method of claim 7, further comprising:

detecting an amount of a power deficit resulting from the power supply deficit;

selecting a number of backup battery units based on the power deficit and an available power of each backup battery unit of the plurality of backup battery units; and reconfiguring a plurality of switching systems associated with the selected number of backup battery units from the first configuration to the second configuration such that the selected number of backup battery units provide power to the plurality of electronic components through the backup power supply pathway.

9. The method of claim 7, further comprising:

prior to selecting the backup battery unit, configuring the switching system in the first configuration and causing the backup battery unit to provide power to the electronic component of the plurality of electronic components associated with the backup battery unit.

10. The method of claim 7, wherein the indication of the power supply deficit is an indication of imminent power supply disruption, the method further comprising:

determining a severity of the power supply deficit;

comparing the severity of the power supply deficit to a threshold; and reconfiguring the switching system from the first configuration to the second configuration in response to the severity of the power supply deficit exceeding the threshold.

11. The method of claim 7, further comprising:

causing a generator to provide an amount of generator power to the plurality of electronic components through the backup power supply pathway in response to receiving the indication of the power supply deficit;

detecting a power demand associated with the plurality of electronic components;

determining a power deficit based on the power demand and the amount of generator power;

selecting a number of backup battery units based on the power deficit and the available power of each backup battery unit of the plurality of backup battery units; and reconfiguring a plurality of switching systems associated with the selected number of backup battery units from the first configuration to the second configuration.

12. The method of claim 7, further comprising:

in response to receiving the indication of the power supply deficit, selecting a subset of low-priority electronic components from the plurality of electronic components; and causing the subset of low-priority electronic components to enter a low power state or a powered-down state.

13. The method of claim 12, further comprising:

selecting a subset of the backup battery units associated with the subset of low-priority electronic components; and reconfiguring a plurality of switching systems associated with the selected subset of backup battery units from the first configuration to the second configuration.

14. The method of claim 7, wherein the power supply deficit is a reduced power supply, the method further comprising:

detecting a power demand associated with the plurality of electronic components;

determining a power deficit based on the power demand and the reduced power supply;

comparing the power deficit to a threshold; and reconfiguring a plurality of switching systems associated with the backup battery unit from the first configuration to the second configuration based on the power deficit exceeding a threshold.

15. A system, comprising:

a controller configured with executable instructions in order to:

receive an indication of a power supply deficit in a main power supply that supplies power to a plurality of electronic components;

select a subset of backup battery units from a plurality of backup battery units associated with the plurality of electronic components;

reconfigure one or more switching systems associated with the subset of backup battery units from a first configuration, in which each one of the backup battery units is electrically connected with the plurality of the electronic components, to a second configuration, in which the subset of backup battery units are electrically connected with a backup power supply pathway that is connected with the plurality of electronic components; and cause the subset of backup battery units to provide power to the plurality of electronic components by way of the backup power supply pathway.

16. The system of claim 15, wherein the controller comprises a central power system controller operably connected with the main power supply and with each backup battery unit of the plurality of backup battery units.

17. The system of claim 15, wherein:

each electronic component is electrically connected with a respective power supply unit of a plurality of power supply units, each respective power supply unit configured to direct power between a respective electronic component, the main power supply, and a respective backup battery unit; and the controller comprises a controlling power supply unit selected from among the plurality of power supply units.

18. The system of claim 15, wherein the controller is further configured to:

temporarily configure the switching systems in the first configuration such that each backup battery unit provides power to a respective electronic component prior to reconfiguring the switching systems to the second configuration such that the selected subset of backup battery units provides power to the plurality of electronic components through the backup power supply pathway.

19. The system of claim 15, wherein the controller is further configured to:

detect an amount of power deficit associated with the power supply deficit; and add a number of the backup battery units to the subset based on the power deficit and the available power supply of the backup battery units.

20. The system of claim 15, wherein the controller is further configured to:

modify the power provided by each backup battery unit of the subset of the backup battery units to synchronize with a voltage cycle of a polyphase power supply.

* * * * *